United States Patent [19]

Kanba et al.

[11] Patent Number: 5,294,477
[45] Date of Patent: Mar. 15, 1994

[54] FUNCTIONALLY GRADIENT CIRCUIT BOARD

[75] Inventors: Seiji Kanba; Nobuyuki Wada; Harunobu Sano; Hiroshi Takagi, all of Nagoakakyo, Japan

[73] Assignee: Murata Mfg. Co., Ltd., Japan

[21] Appl. No.: 796,309

[22] Filed: Nov. 22, 1991

[30] Foreign Application Priority Data

Nov. 30, 1990 [JP] Japan .................. 3-339278

[51] Int. Cl.⁵ .............................. B32B 9/00
[52] U.S. Cl. .................... 428/212; 428/217; 428/446; 428/450; 428/472; 428/325; 428/328
[58] Field of Search ........... 428/209, 210, 212, 901, 428/325, 328, 217, 446, 450, 472; 29/182.2, 182.3, 182.5

[56] References Cited

U.S. PATENT DOCUMENTS

| | | | |
|---|---|---|---|
| 3,079,282 | 2/1963 | Haller et al. | 117/212 |
| 3,859,128 | 1/1975 | Burks et al. | 428/426 |
| 3,975,165 | 8/1976 | Elbert et al. | 29/182 |
| 4,751,099 | 6/1988 | Niino et al. | 427/34 |
| 4,939,022 | 7/1990 | Palanisamy | 428/901 |

Primary Examiner—Patrick J. Ryan
Assistant Examiner—Kathy K. Lee
Attorney, Agent, or Firm—Ostrolenk, Faber, Gerb & Soffen

[57] ABSTRACT

A functionally gradient circuit board is constituted by a mixture of a metal and an insulating ceramic composition, the abundance ratio of the metal component to the component of the insulating ceramic composition being changed in the direction of thickness of the board.

15 Claims, 4 Drawing Sheets

FUNCTIONALLY GRADIENT CIRCUIT BOARD

BACKGROUND OF THE INVENTION

1. Field of the Invention

The present invention relates generally to a circuit board such as an IC board, and more particularly, to a circuit board constructed using a functionally gradient material.

2. Description of the Prior Art

Conventionally, circuit boards made of various materials have been used so as to construct an electronic circuit. Of the circuit boards, a high power IC board and a power module board are constructed using a material superior in thermal conductivity because a circuit element carried thereon generates a great amount of heat.

One example of the circuit boards constructed using, for example, a metal material is shown in FIG. 6. A metal composite board 1 shown in FIG. 6 has a structure in which a metal plate 1a made of aluminum or the like, a synthetic resin layer 1b made of epoxy resin or the like, and a copper foil 1c are laminated. In the metal composite board 1, heat generated in a circuit element carried thereon is effectively radiated utilizing high thermal conductivity of the metal plate 1a. In addition, the metal composite board 1 is superior in mechanical strength to a ceramic board because it uses the metal plate 1a as a base material.

However, the metal composite board 1 has the disadvantage in that it is not sufficiently high in heat resistance so that it is liable to be softened at a temperature of a maximum of 300° C. because the synthetic resin layer 1b is provided so as to achieve electrical insulation.

Moreover, since the metal composite board 1 has the above described laminated structure, it also has the disadvantage in that thermal stress is concentrated on the boundary between the layers due to the difference in coefficients of thermal expansion of materials of the respective layers, so that stripping or the like is liable to occur in the boundary between the layers due to heat shock.

SUMMARY OF THE INVENTION

Accordingly, an object of the present invention is to provide a circuit board having a structure which can withstand relatively high temperatures and does not easily cause the stripping or the like due to heat shock.

A circuit board according to the present invention is constituted by a mixture of a metal and an insulating ceramic composition, and is characterized by being so constructed as to have such a functionally gradient structure that the abundance ratio of the metal component to the component of the insulating ceramic composition is changed in the direction of thickness of the board.

The functionally gradient material is a material whose composition is changed as a function of the position in the material so that material characteristics are changed depending on the position in the material. In the present invention, the metal component and the component of the ceramic composition constitute the functionally gradient material, so that the coefficient of thermal expansion or the insulating properties are changed in the direction of thickness of the board.

According to the present invention, there can be provided a functionally gradient circuit board in which the abundance ratio of the metal component to the component of the insulating ceramic composition is changed in the direction of thickness of the board, so that the coefficient of thermal conductivity and the insulation resistance are changed in the direction of thickness of the board. In the present invention, therefore, the coefficient of thermal conductivity and the insulation resistance in the direction of thickness of the board can be arbitrarily changed by devising the way of changing the abundance ratio of the metal component to the component of the insulating ceramic composition, thereby to make it possible to obtain a circuit board having desired thermal conductivity and insulation resistance properties.

Moreover, in the present invention, a material which is problem in terms of heat resistance, for example, insulating resin need not be interposed, so that the heat resistance of the circuit board is effectively enhanced and there is no possibility of stripping or the like due to heat shock.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The principle of the present invention will be described with reference to the drawings.

Figure 1:
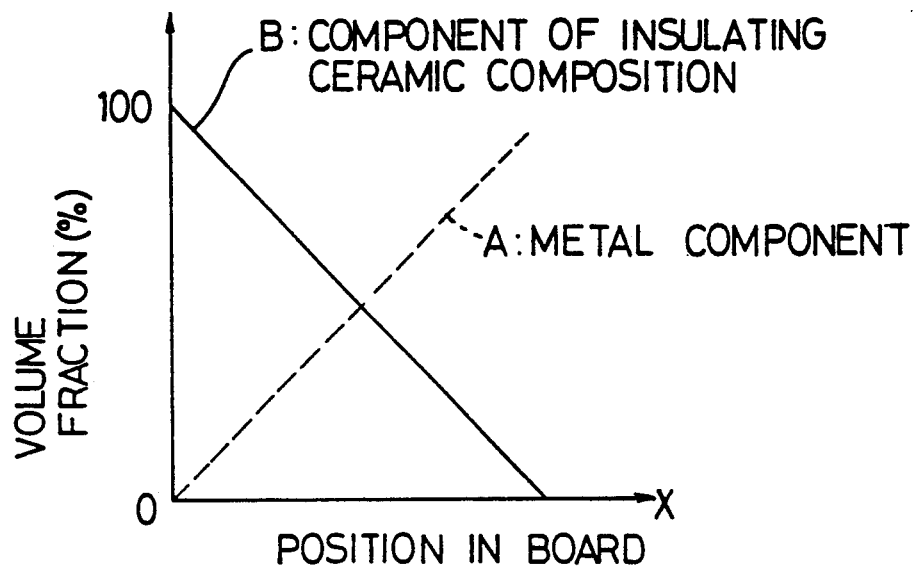
FIG. 1 is a diagram showing the change in the volume fraction in the direction of thickness of the metal component and the component of an insulating ceramic composition in a circuit board according to the present invention.
Figure 2:
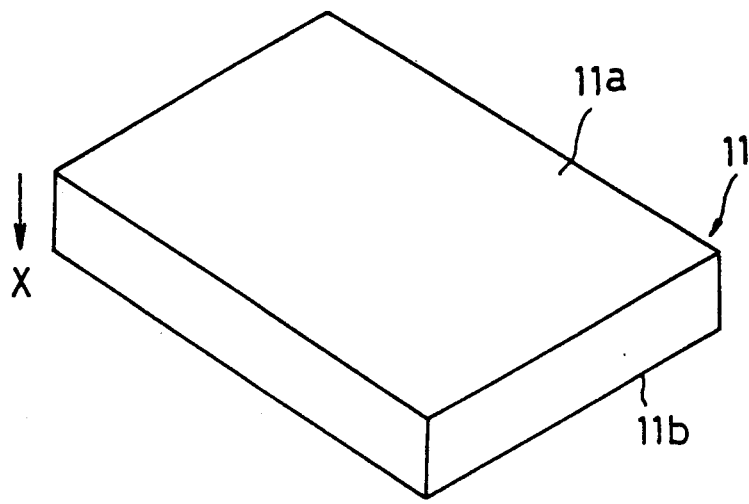
FIG. 2 is a perspective view showing a circuit board constructed in accordance with the present invention.

A rectangular circuit board 11 shown in FIG. 2 is constructed in accordance with the present invention. In this case, the circuit board 11 is constituted by a mixture of a metal and an insulating ceramic composition. As shown in FIG. 1, the volume fraction of the metal component (indicated by a broken line A) and the volume fraction of the component of the insulating ceramic composition (indicated by a solid line B) shall be continuously changed in the x direction, that is, in the direction of thickness.

Figure 3:
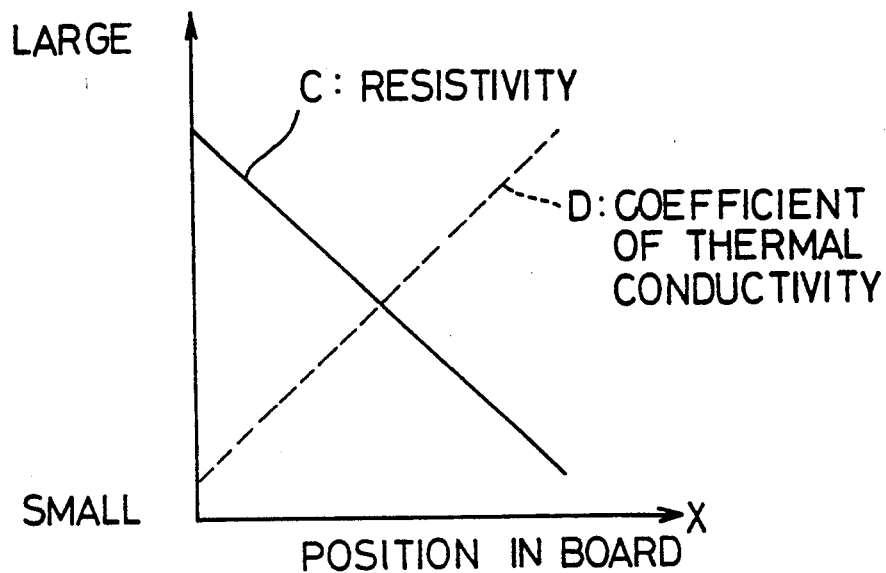
FIG. 3 is a diagram showing the change in the resistivity and the coefficient of thermal conductivity in the direction of thickness in the circuit board shown in FIG. 2.

Considering that properties of the board follow the mixture rule in the mixture of the metal and the insulating ceramic composition, the resistivity and the coefficient of thermal conductivity of the board 11 are as shown in FIG. 3. In FIG. 3, a solid line C indicates the resistivity, and a broken line D indicates the coefficient of thermal conductivity.

Consequently, as can be seen from FIG. 3, in the board 11 constructed in accordance with the present invention, the resistivity is continuously decreased and the coefficient of thermal conductivity is continuously increased from the upper surface 11a to the lower surface 11b.

Figure 4:
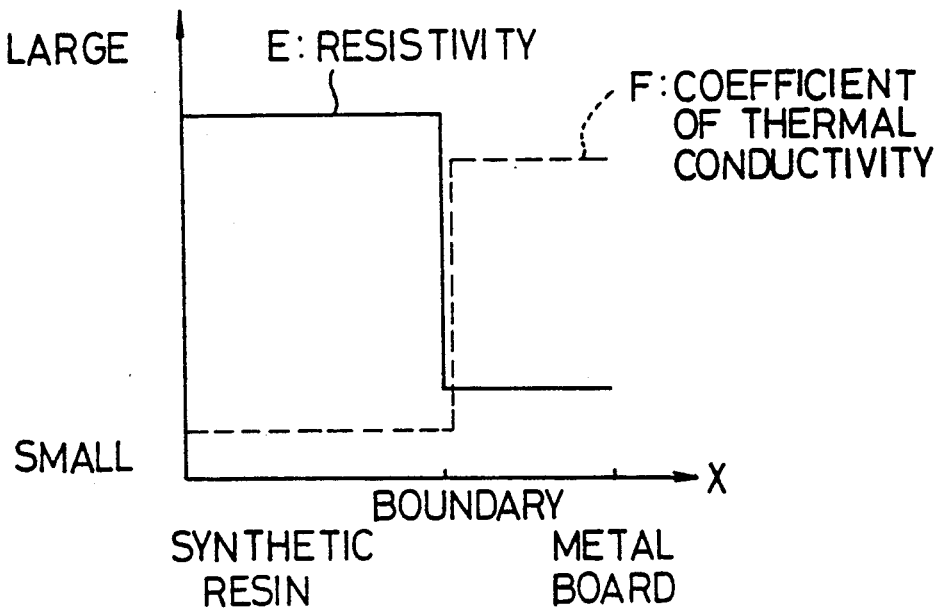
FIG. 4 is a diagram for explaining the change in the resistivity and the coefficient of thermal conductivity in the direction of thickness in a conventional example shown in FIG. 6.
Figure 6:
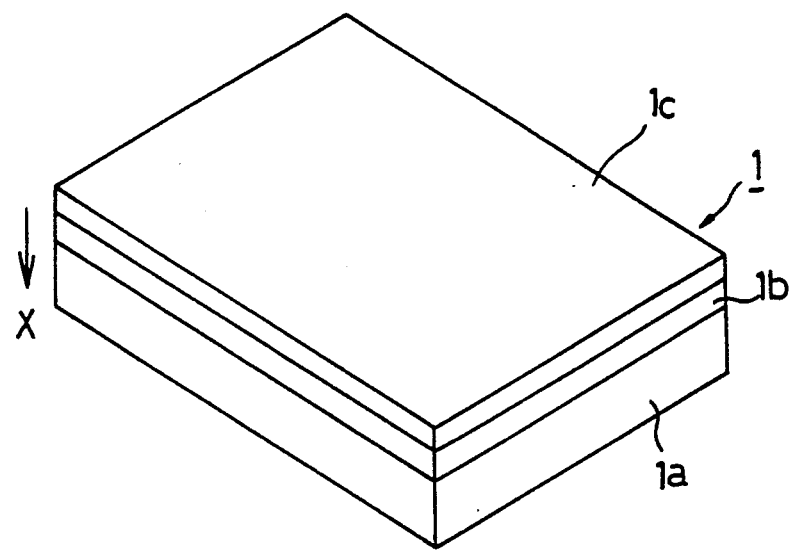
FIG. 6 is a perspective view showing a conventional metal composite board.

On the other hand, in the conventional metal composite board 1 shown in FIG. 6, the resistivity and the coefficient of thermal conductivity are respectively as shown in FIG. 4. More specifically, in the conventional metal composite board 1, a metal plate 1a is disposed on the side of its lower surface, and an insulating synthetic resin layer 1b is formed on the upper surface of the metal plate 1a. Accordingly, the resistivity (indicated by a solid line E) and the coefficient of thermal conductivity (indicated by a broken line F) are changed in a stepped manner. As can be seen from the comparison between FIG. 3 and FIG. 4, a board having the same coefficient of thermal conductivity and the same resistivity as those of the metal composite board 1 can be constructed in accordance with the present invention if consideration is given to the entire board.

More specifically, the present invention is characterized in that a board having gradient functionality in the direction of thickness is constructed using a metal and an insulating ceramic composition, thereby to obtain desired insulation resistance properties and thermal conductivity. In the present invention, the metal and the ceramic composition form a functionality gradient structure, so that the coefficient of thermal expansion is continuously changed in the direction of thickness of the board. Consequently, in the board, stripping or the like based on the difference in the coefficient of thermal expansion is not liable to occur.

As a metal usable in the present invention, Ag, Pd, Pt. Ni, Cu and the like are listed. On the other hand, as an insulating ceramic composition, insulating ceramics such as alumina, PSZ and borosilicate glass ceramics are used. Further, a mixture of the metal and the insulating ceramic composition is obtained by mixing metal powder with insulating ceramic composition powder. Used as the metal powder is one having a particle diameter of approximately 0.1 to 10 $\mu$m is used, while used as the insulating ceramic composition powder is one having a particle diameter of approximately 0.1 to 5.0 $\mu$m.

The above described metal powder and insulating ceramic composition powder are mixed with each other by an arbitrary mixing method such as a method using a ball mill, and are further formed by an arbitrary forming method. A mixture formed is then sintered at a predetermined temperature, thereby to construct a circuit board according to the present invention.

EXAMPLE

As raw materials, alumina powder (having an average particle diameter of 0.3 $\mu$m and having purity of 99.9%) and silver powder (having an average particle diameter of 3.0 $\mu$m and having purity of 99.9%) are prepared.

The alumina powder and the silver powder are respectively weighed such that the weight ratio is 10:0, 9:1, 8:2, 7:3, 6:4, 5:5, 4:6, 3:7, 2:8, 1:9 and 0:10, to obtain a total of 11 types of mixed powder.

50 g of each of the types of mixed powder is uniformly mixed for about two hours by a wet ball mill process using an ethanol-toluene liquid mixture obtained by mixing ethanol and toluene at a weight ratio of 7 to 3 and a PSZ ball. Then, 6 to 12% by weight of a binder of a polyvinyl butyral system, 0.5 to 2.0% by weight of a dispersant of a sorbitan fatty acid ester system, and 1 to 5% by weight of a plasticizer of a dioctyl phthalate system are added to a mixture obtained, followed by mixing for about 24 hours. A slurry obtained is formed into a green sheet having a thickness of 80 $\mu$m by a Doctor Blade process. Thus, 11 types of green sheets are obtained.

Figure 5:
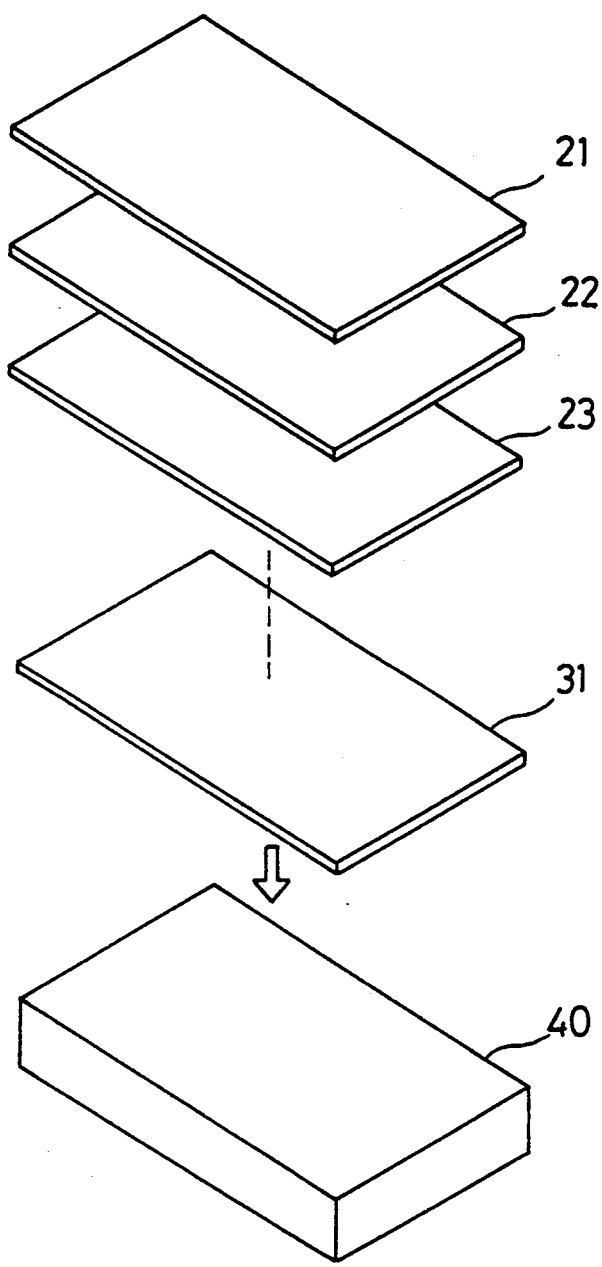
FIG. 5 is a perspective view showing green sheets and a laminated body used in the present embodiment.

As shown in FIG. 5, the 11 types of green sheets obtained are laminated such that the mixing ratio of alumina to silver is substantially changed continuously. In FIG. 5, a green sheet 21 contains only alumina, while a green sheet 31 contains only silver. The silver content is gradually increased from the green sheet 22 to the green sheet 30. Then, a laminated body 40 comprising the 11 green sheets is heat-pressed and then, is cut in the direction of thickness, to prepare a board-shaped sample being 40×20×0.8 mm in external dimensions.

The sample obtained is fired at a temperature of 400° C. in the air for ten hours, thereby to burn its organic component and then, is fired at a temperature of 1000° to 1200° C. in the air for about three hours, thereby to obtain a functional circuit board having a functionally gradient structure comprising alumina and silver.

For comparison, a metal composite board (which is commercially available) being 40×30 mm in dimensions which comprises aluminum (having a thickness of 1 mm), epoxy resin (having a thickness of 100 $\mu$m) and a copper foil (having a thickness of 40 $\mu$m) is prepared.

As a result of measuring the coefficient of thermal conductivity in the direction of thickness of each of the boards using a laser flush process, the metal composite board is $90 \times 10^{-3}$ cal/cm·sec·° C., while the board according to the example is $200 \times 10^{-3}$ cal/cm·sec·° C.

Both the boards are compared with each other in terms of heat resistance using an electric furnace provided that the speed at which the temperature is raised or lowered is 200° C. per hour and the maximum temperature holding time is one hour. The relationship between the maximum temperature and the deformation of the board is examined. It is assumed that the board is deformed when the length which is 40 mm of its long side is changed by not less than 1%. The metal composite board is deformed at a temperature of 200° C., while the board according to the example warps at a temperature of 800° C.

The heat cycle test is performed 100 times using a temperature bath provided that the highest temperature is 125° C., the lowest temperature is −40° C. (which is held for 30 seconds), and the speed at which the temperature is raised or lowered is 10° C. per second.

The above described heat cycle test is performed with respect to respective 100 boards in the conventional example and in the example, to find the percentage of acceptable products by considering destroyed one or one showing signs of destruction as a defective product. Consequently, the percentage of acceptable products is 62% in the metal composite board, while being 100% in the board according to the example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A functionally gradient circuit board having electrical and thermal insulation properties that change as a function of position in the direction of thickness of the board, the circuit board comprising a mixture of a metal and an electrically insulating ceramic compound having a coefficient of thermal conductivity lower than said metal, wherein said mixture of said metal and said electrically insulating ceramic compound contains said metal and said electrically insulating ceramic compound in a ratio that changes in the direction of thickness of the board so that the electrical and thermal insulation properties of said circuit board correspondingly change as a function of position in the direction of the thickness of the board.

2. The functionally gradient circuit board according to claim 1, wherein said ratio of said metal to said electrically insulating ceramic compound changes substantially continuously in the direction of thickness of the board.

3. The functionally gradient circuit board accordingly to claim 1, wherein the coefficient of thermal conductivity of said circuit board changes as a function of position in the direction of the thickness of the board.

4. The functionally gradient circuit board according to claim 1, wherein said circuit board comprises a plurality of layers, the layers being laminated in the thickness direction of the circuit board, each layer having said metal and said electrically insulating ceramic compound in a ratio which is different from the ratio of the metal and ceramic compound in an adjacent layer.

5. The functionally gradient circuit board according to claim 1, where said electrically insulating ceramic compound is alumina.

6. The functionally gradient circuit board according to claim 1, wherein said metal is silver.

7. The functionally gradient circuit board according to claim 1, wherein the coefficient of thermal expansion of said circuit board changes as a function of position in the direction of the thickness of the board.

8. The functionally gradient circuit board according to claim 7, wherein the coefficient of thermal expansion of said circuit board continuously changes in the direction of the thickness of the board.

9. The functionally gradient circuit board according to claim 1, wherein the electrical insulation property of said circuit board continuously changes in the direction of the thickness of the board.

10. The functionally gradient circuit board according to claim 1, wherein the coefficient of thermal conductivity of said circuit board continuously changes in the direction of the thickness of the board.

11. The functionally gradient circuit board according to claim 1, wherein the electrical insulation property, the coefficient of thermal expansion and the coefficient of thermal conductivity of said circuit board change as a function of position in the direction of the thickness of the board.

12. A functionally gradient circuit board having electrical and thermal insulation properties that change as a function of position in the direction of thickness of the board, the circuit board comprising a mixture of a metal and an electrically insulating ceramic compound having a coefficient of thermal conductivity lower than said metal, wherein said mixture of said metal and said electrically insulating ceramic compound contains said metal and said electrically insulating ceramic compound in a ratio that changes in the direction of thickness of the board so that the electrical resistance property, the coefficient of thermal expansion and the coefficient of thermal conductivity of said circuit board correspondingly change as a function of position in the direction of the thickness of the board.

13. The functionally gradient circuit board according to claim 12, wherein the coefficient of thermal conductivity of said circuit board continuously changes in the direction of the thickness of the board.

14. The functionally gradient circuit board according to claim 12, wherein the electrical insulation property of said circuit board continuously changes in the direction of the thickness of the board.

15. The functionally gradient circuit board according to claim 12, wherein the coefficient of thermal expansion of said circuit board continuously changes in the direction of the thickness of the board.

* * * * *